United States Patent [19]

Saunders et al.

[11] 4,232,356
[45] Nov. 4, 1980

[54] LOGIC CARD FRAME

[75] Inventors: Michael A. Saunders, Farmington; Robert W. Irwin, Livonia, both of Mich.

[73] Assignee: Burroughs Corporation, Detroit, Mich.

[21] Appl. No.: 9,932

[22] Filed: Feb. 7, 1979

[51] Int. Cl.³ .............................................. H05K 7/14
[52] U.S. Cl. ............................ 361/415; 174/DIG. 9; 211/41; 361/391; 361/412
[58] Field of Search ............... 361/415, 420, 403, 394, 361/399; 174/DIG. 9; 211/41

[56] References Cited

U.S. PATENT DOCUMENTS

| 3,011,098 | 11/1961 | Godley | 361/391 X |
|---|---|---|---|
| 3,316,460 | 4/1967 | Scoville | 361/415 |
| 3,662,225 | 5/1972 | Carter | 361/391 X |
| 3,805,212 | 4/1974 | Landman | 361/403 X |
| 3,899,721 | 8/1975 | Borchard | 211/41 X |
| 3,932,016 | 1/1976 | Ammenheuser | 361/415 X |
| 3,939,382 | 2/1976 | Lacan | 211/41 X |
| 4,048,669 | 9/1977 | Bowler | 361/415 X |

FOREIGN PATENT DOCUMENTS 1147280  4/1963  Fed. Rep. of Germany .......... 361/415

Primary Examiner—Richard R. Kucia
Attorney, Agent, or Firm—Kenneth J. Cooper; Charles E. Quarton; Kevin R. Peterson

[57] ABSTRACT

A logic card frame for housing removable printed circuit boards comprises a pair of identical one piece molded half frames that are snapped together, stackable, and slideable from an inserted to a withdrawn position within an associated rack or cabinet. The assembled half frames include integrally molded circuit board guide tracks, each with a groove, a flexure, and a raised portion to guide and prevent vibration of a printed electrical circuit board inserted into a guide track. The base on which the logic card frame is slideably mounted has a ratcheted latch and leaf spring combination for retaining the inserted logic card frame.

4 Claims, 9 Drawing Figures

LOGIC CARD FRAME

BACKGROUND OF THE INVENTION

1. Field of the Invention

This invention involves a logic card frame for housing electrical printed circuit boards.

2. Description of the Prior Art

In the past, a housing for electrical printed circuit boards consisted of many individual parts. At least two side members were needed to establish the depth of the housing while width and height were generally provided by four rails. After joining these to form the perimeter, complimentary guide tracks were installed on opposing interior surfaces of the housing to define the insertion and withdrawal path of each printed circuit board. However, the assembly of these many components proved too costly and consumed more time and labor than was desirable for producing a printed circuit board housing.

Prior housings have been slideably mounted for withdrawal to facilitate exposing and servicing of the contained circuit boards. When the housing is fully inserted, though, frictional and fastening devices for maintaining that position have varied in approach and effect.

The present invention offers a low cost circuit board housing and an effective device for variably maintaining a slideably mounted housing in a fully inserted position. The invention also restricts horizontal and vertical vibration of housed circuit boards and allows vertical stacking of additional circuit board housings.

SUMMARY OF THE INVENTION

The present invention eliminates the piecemeal construction characteristic of prior circuit board housing designs by providing a pair of identical one piece molded half frames which embody the features of a logic card frame. Each half frame includes integrally molded elements establishing the depth, width, and half the height of the complete unit. Four height elements provide an alternating snap member and shelf which engage the four height elements of an identical but inverted half frame to form an entire logic card frame. Multiple guide tracks for inserted printed circuit boards are integrally molded with each half frame. Flexures and raised portions are included in each guide track to respectively restrict horizontal and vertical vibration of the housed circuit boards when two half frames are snapped together. Consequently, using one molded half frame twice by aligning and snapping together the four height elements produces a logic card frame with properly positioned circuit board guide tracks and vibration restrictors in less time with less labor than that required with prior circuit board housing designs.

The one piece molded half frame includes frame members having a hole and a recess positioned for fastenable alignment with a frame member having a complimentary recess and hole. This feature allows vertical stacking of assembled logic card frames.

The invention is slideably mounted on a base having a slot, a latch having one end molded with a set of ratcheted teeth and one end insertable in the slot, and a leaf spring. The leaf spring is designed to be held in the slot by the latch while also forcing upward the latch end with the ratchet teeth to variably engage and retain the fully inserted logic card frame. The variable engagement feature allows more positioning latitude when inserting the logic card frame and when slideably mounting the frame to the base. The interaction of the slot, latch, and leaf spring allows their functioning while requiring no additional fastener to secure them to the base.

DESCRIPTION OF THE PREFERRED EMBODIMENT

Figure 1:
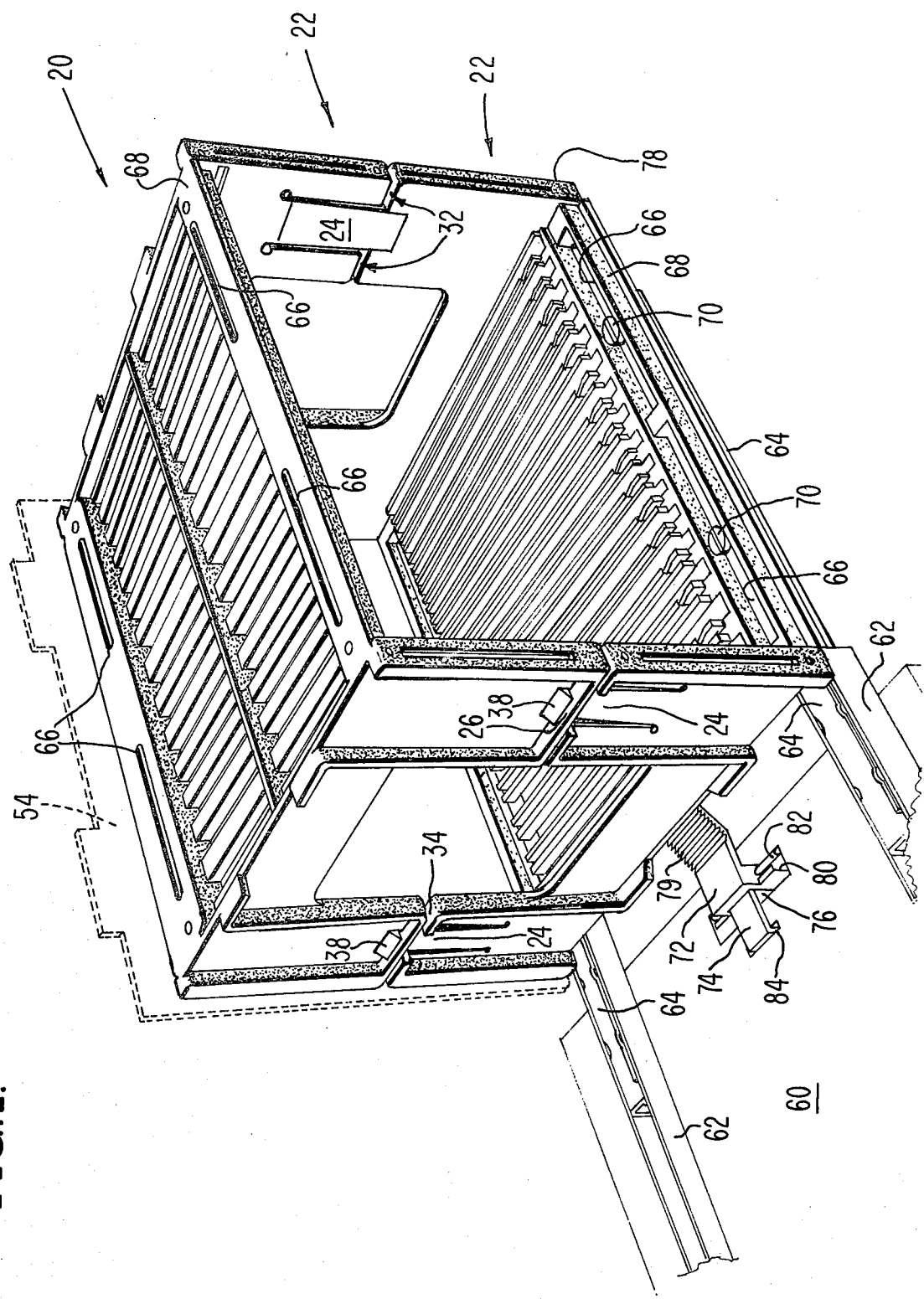
FIG. 1 is a true perspective of an assembled logic card frame, fully withdrawn from its associated rack or cabinet.
Figures 2, 3:
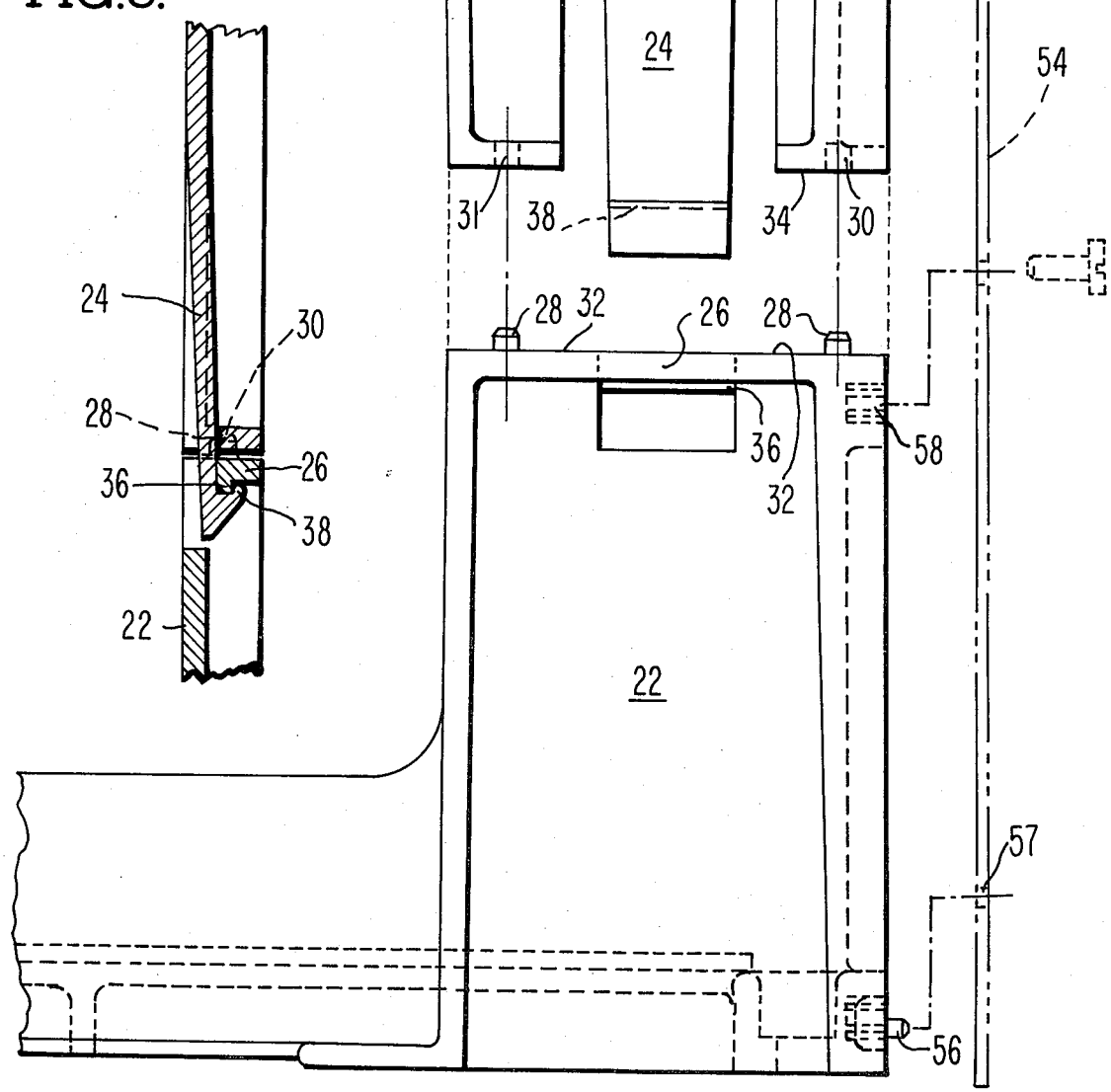
FIG. 2 is a side view of two partial one piece molded half frames about to be snapped together.
FIG. 3 is a side view showing two partial one piece molded half frames snapped together.

Referring to FIG. 1, a logic card frame 20 for housing printed circuit boards (not shown) is constructed from two identical one piece molded half frames 22 that are manually snapped together. To insure the proper orientation of the half frames for assembly so that the intended front of each half frame is always in front, each half frame 22 has two snap members 24 on one side and a shelf 26 on the other side of the half frame 22 for each snap member 24. FIG. 2 shows that the half frames 22 are approximately aligned by contacting the snap member 24 with the corresponding shelf 26. As the half frames 22 are forced together, they are accurately positioned for engagement by alignment studs 28, a round alignment hole 30, and elongated alignment holes 31 which allow for minor dimensional variation caused by molding the half frames. The studs and the holes are integrally molded with each half frame. The alignment studs 28 protrude from a first platform 32 associated with each shelf 26 while the alignment holes 30 and 31 are contained within a second platform 34 associated with each snap member 24. The completely snapped together view of the half frames is shown in FIG. 3. To hold the snap member 24 in snapped engagement with the shelf 26, FIG. 3 also illustrates a molded lip 36 on the shelf 26 that fits under a claw portion 38 of the snap member 24.

Figure 4:
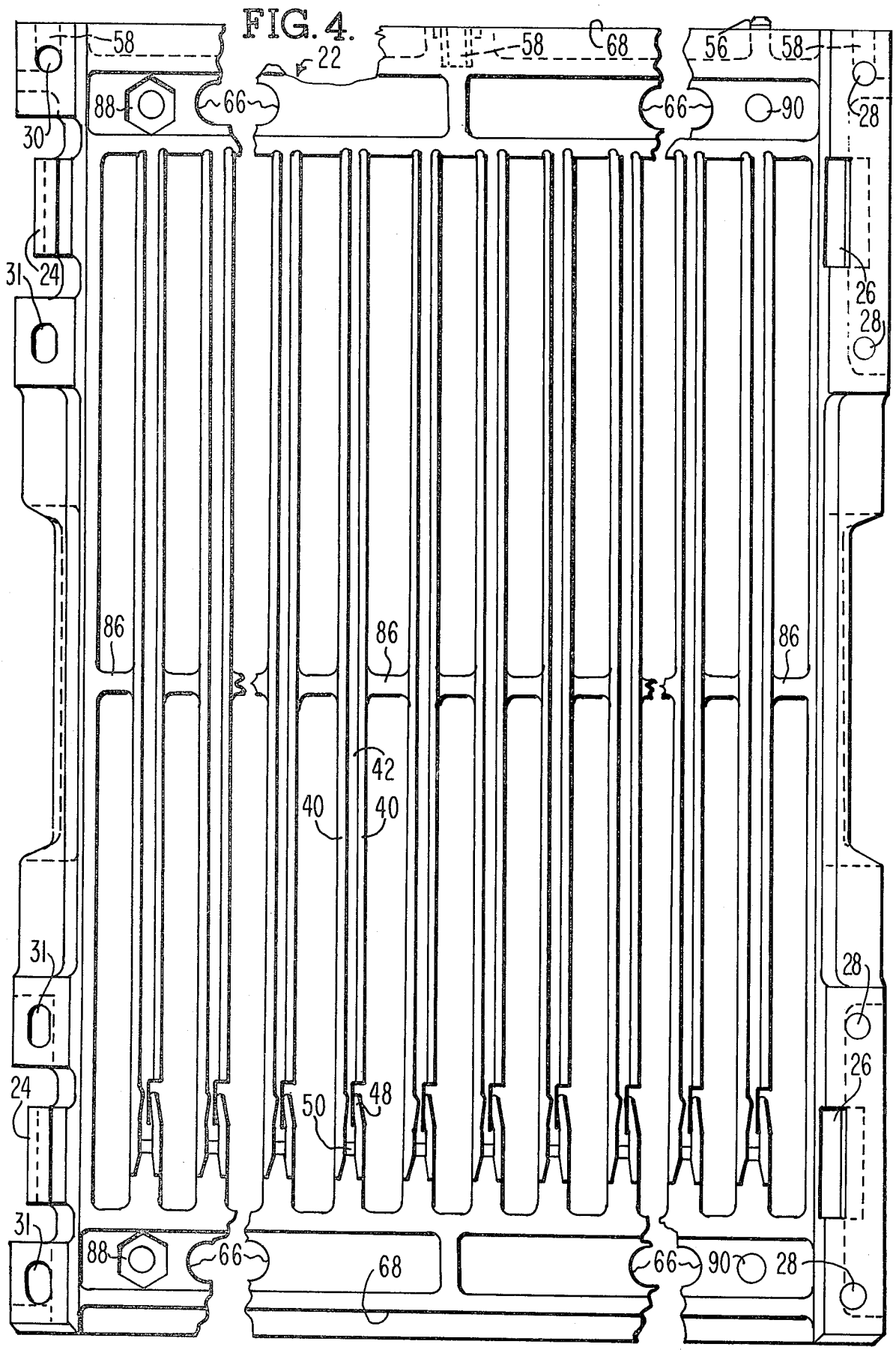
FIG. 4 is a top view, partially broken, of a one piece molded half frame.
Figure 5:
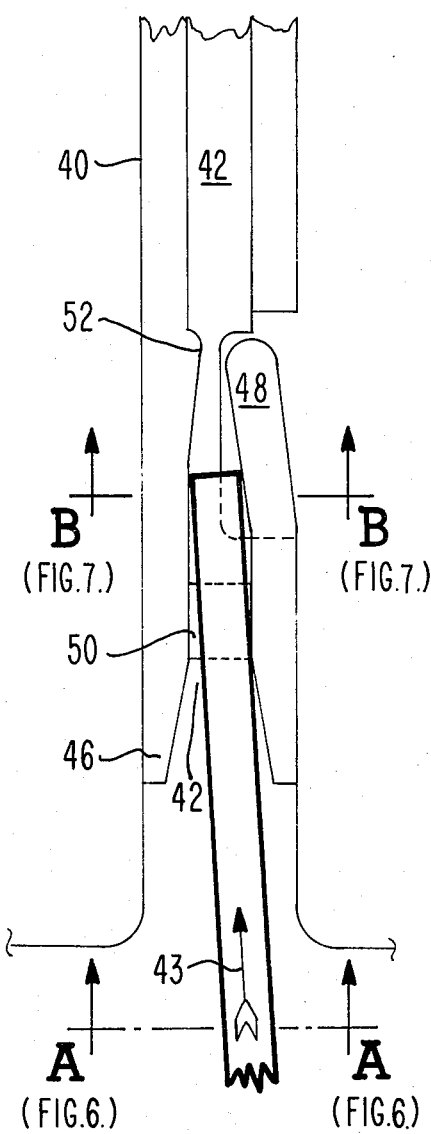
FIG. 5 is a top view of a circuit board track showing the relative position of a flexure prior to the insertion of a printed circuit board.
Figure 9:
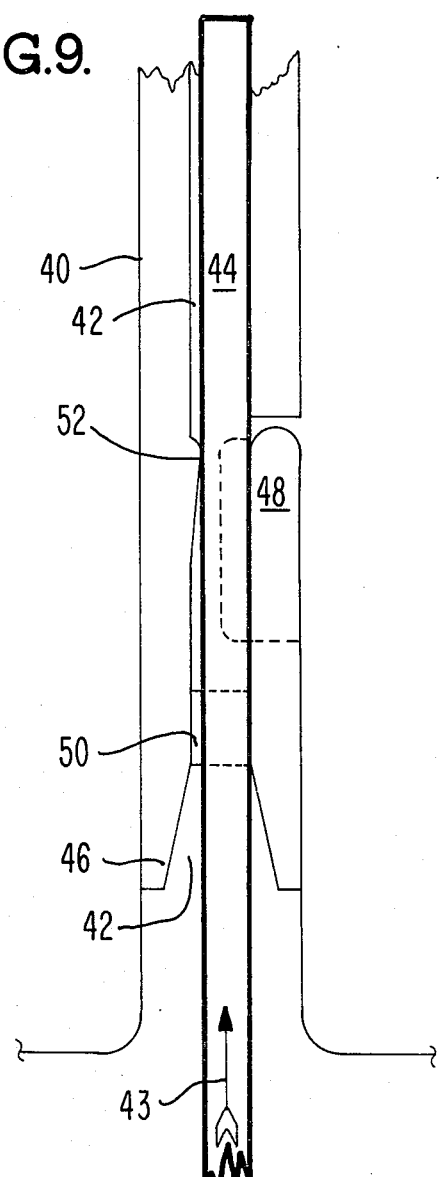
FIG. 9 is a top view of a circuit board track showing the relative position of a flexure subsequent to the insertion of a printed circuit board.
Figure 6:
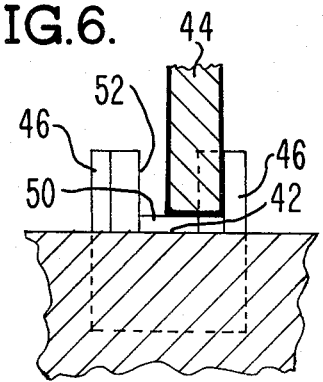
FIG. 6 is a front view of FIG. 3 taken at section line A—A.
Figure 7:
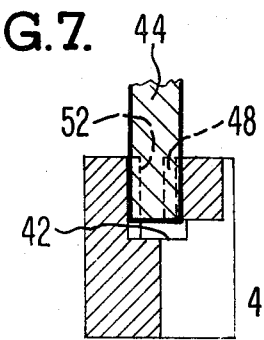
FIG. 7 is a front view of FIG. 3 taken at section line B—B.
Figure 8:
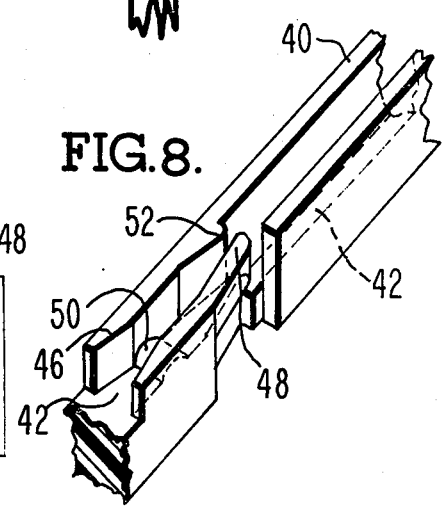
FIG. 8 is an isometric view of a partial circuit board track.

With the two identical half frames snapped together, the logic card frame is assembled for receiving printed circuit boards. Referring to FIGS. 1 and 4, each half frame 22 accepts printed circuit boards in circuit board tracks 40, each having a groove 42 slightly wider than the inserted circuit board as shown in FIG. 9. When the half frames are joined, these tracks 40 are aligned to guide the top and bottom edges of each inserted circuit board. FIGS. 5–9 depict how the vibration of each printed circuit board 44 is restricted within each circuit board track 40. In FIG. 5, a printed circuit board 44 is guided in the direction of the arrow 43 by a throat 46 in the groove 42 of each track 40 until contact is made with a flexure 48 and the wall of the groove. Simultaneously, the vertical vibration of the circuit board 44 is inhibited by contacting a raised portion 50 (FIGS. 6-8) in the groove 42 of the upper and lower tracks 40 of the joined half frames. Horizontal vibration of the circuit board is inhibited (FIG. 9) by continuing to insert the circuit board 44 into the groove 42 and forcing the normally restrictive flexure 48 in an outward direction. The resilient action of the flexure 48 then reacts to hold the circuit board 44 against a narrowing portion 52 of the groove walls.

To support the leading end of the inserted circuit board when fully inserted and provide the vertical and horizontal vibration inhibition, a motherboard 54 (FIG. 1) with resilient sockets (not shown) for securely holding inserted circuit boards is fastenable on the logic card frame 20. As shown in FIGS. 2 and 4, a mounting stud 56 is integrally molded with each half frame 22 and serves to engage corresponding holes 57 in the motherboard 54 for proper positioning. Screw receptacles 58 are molded with each half frame 22 to secure the motherboard 54 to the logic card frame.

Referring to FIG. 1, the logic card frame 20 is slideable from an inserted to a withdrawn position within an associated rack or cabinet. To slide and partially expose an enclosed logic card frame 20, a mounting base 60 has a first pair of drawer slides 62 in which a second pair of drawer slides 64 ride. This second pair of drawer slides 64 is slideably attached to the logic card frame 20. The complete withdrawal of the logic card frame 20 from an associated rack or cabinet is achieved by a pair of channels 66 (FIGS. 1 and 4) in frame members 68 of each half frame 22 and retaining fasteners 70 which hold the logic card frame 20 in slideable engagement with the second pair of drawer slides 64.

To securely retain the logic card frame 20 in a fully inserted position, a latch 72 (FIG. 1), housed in a slot 76 in the mounting base 60, interacts with a leafspring 74 to variably engage the front portion 78 of the logic card frame with a set of ratchet teeth 79 molded into the latch 72. The latch 72 has the upward travel of its legs 80 prompted by the leaf spring 74 and limited by a slot overhand 82. The leaf spring 74 has the upward force of the end acting on the latch 72 countered by a retaining slot 84 in the mounting base 60. The result of the latch, leaf spring, and slots in combination is that no additional fastener is needed to keep the latch 72 and leaf spring 74 in place. While the engagement of the ratchet teeth 79 with the front portion 78 of the inserted logic card frame 20 is automatic due to the upward force of the leaf spring 74 on the latch 72, disengagement is accomplished by depressing the end of the latch with the ratchet teeth and simultaneously pulling the logic card frame outwardly from its associated rack or cabinet. As the logic card frame is withdrawn, a center rib 86 (FIG. 4) which is integral with the half frame 22 keeps the latch 72 depressed and prevents the logic card frame from engaging the ratchet teeth 79.

Anticipating that a user might want to vertically stack logic card frames 20, each half frame provides frame members 68 (FIG. 4) with an integrally molded hexagonal recess 88 and hole 90. These will align with a complimentary hole 90 and recess 88 in a stacked logic card frame to respectively provide a channel and seat for a fastening nut and bolt.

What is claimed is:

1. A logic card frame for housing removable printed circuit boards comprising:
   a pair of identical one piece molded half frames integrally molded with a multiplicity of circuit board tracks for guiding an inserted printed circuit board;
   a flexure, integrally molded with the printed circuit board track, that exerts opposing, sideways pressure on a side portion of the inserted printed circuit board in the circuit board track;
   means for restricting vertical vibration of the inserted printed circuit board;
   means for locking together the pair of identical one piece molded half frames to form the logic card frame;
   a mounting base;
   means on the mounting base for sliding the logic card frame from an inserted to a withdrawn position for exposing and servicing the housed printed circuit boards;
   means for mounting the logic card frame in a slidable fashion on the sliding means;
   means for retaining the logic card frame in the inserted position; and
   means, integral with each identical one piece molded half frame, for stacking multiple logic card frames.

2. The invention of claim 1, wherein the means for retaining the logic card frame in the inserted position comprises means for variably engaging the inserted logic card frame using only a latch and a leaf spring cooperating with the mounting base.

3. A logic card frame for housing removable printed circuit boards comprising:
   a pair of identical, one-piece molded half frames integrally molded with circuit board tracks for guiding inserted printed circuit boards;
   means, integral with each half frame, for locking together the pair of half frames to form the logic-card frame;
   means, integral with each half frame, for restricting vertical vibration of the inserted printed circuit boards; and
   means, integral with each circuit board track, for exerting opposing, sideways pressure on a side portion of the inserted printed circuit board to restrict the printed circuit board's horizontal vibration.

4. The invention of claim 3, wherein the means, integral with each circuit board track, for exerting opposing, sideways pressure on a side portion of the inserted printed circuit board comprises a resilient flexure.

* * * * *